United States Patent [19]

Miura

[11] 4,306,275
[45] Dec. 15, 1981

[54] HYBRID INTEGRATED CIRCUIT UNIT

[75] Inventor: Norio Miura, Oota, Japan

[73] Assignees: Sanyo Electric Co., Ltd., Osaka; Tokyo Sanyo Electric Co., Ltd., Gunma, both of Japan

[21] Appl. No.: 162,422

[22] Filed: Jun. 24, 1980

[30] Foreign Application Priority Data

Jun. 26, 1979 [JP] Japan .................................. 54-80936

[51] Int. Cl.³ .............................................. H05K 1/04
[52] U.S. Cl. ................................... 361/413; 361/388; 339/17 LM; 174/68.5
[58] Field of Search .......... 339/17 CF, 17 M, 17 LM; 174/16 HS, 52 FP, 68.5; 357/75, 80, 81; 361/380–382, 386, 388, 393–395, 412, 413, 415

[56] References Cited

U.S. PATENT DOCUMENTS 3,778,681  12/1973  Wilson .............................. 361/413
4,106,076  8/1978  Miller et al. ...................... 361/394

*Primary Examiner*—Gerald P. Tolin
*Attorney, Agent, or Firm*—Armstrong, Nikaido, Marmelstein & Kubovcik

[57] ABSTRACT

A hybrid integrated circuit unit comprising an integrated circuit assembly having at least one semiconductor device and a plurality of conductors extending to the first connecting terminals, a printed circuit board having at least one discrete element and a plurality of conductors beginning from the second connecting terminals and connecting means for connecting the first and the second connecting terminals, the integrated circuit assembly and the printed circuit board are unified by said connecting means.

8 Claims, 3 Drawing Figures

HYBRID INTEGRATED CIRCUIT UNIT

BACKGROUND OF THE INVENTION

The present invention relates to a hybrid integrated circuit unit in which at least one semiconductor element and one or more discrete circuit elements, such as condensers or resistors, are mounted together on a printed circuit unit.

In the conventional hybrid integrated circuit board, a number of discrete circuit elements such as condensers or resistors are provided on a single printed circuit board together with at least one monolithic or hybrid integrated circuit (IC) chip. As the discrete elements are large compared to the integrated circuit chip, the resulting hybrid integrated circuit board also becomes relatively large even though the purpose of employing the integrated circuit is to minimize overall circuit board size. Therefore, the size advantage of the integrated circuit is unexpectedly cancelled out. In addition, the conventional hybrid integrated circuit board arrangement requires a number of terminal pins to interconnect the discrete elements and the integrated circuit chip, increaseing wire bonding steps during manufacture.

Another drawback of the conventional hybrid integrated circuit unit is that if each lead wire of the discrete elements is connected one at a time to a corresponding printed conductor, the hybrid integrated circuit board can not be manufactured with high efficiency.

In addition, where a high power semiconductor device is incorporated in the conventional hybrid IC circuit board, a large, expensive, highly heat conductive base plate is required, increasing manufacturing cost.

SUMMARY OF THE INVENTION

The present invention eliminates the drawbacks mentioned above, and has as an essential object the providing of a hybrid integrated circuit unit which can be easily efficiently manufactured with automatic equipment.

Another object of the present invention is to provide a compact hybrid integrated circuit unit having at least one semiconductor device associated with at least one discrete circuit element.

A further object is to provide a hybrid integrated circuit unit capable of incorporating a high power semiconductor decive with reduced manufacturing cost.

DETAILED DESCRIPTION OF THE INVENTION

Figure 1:
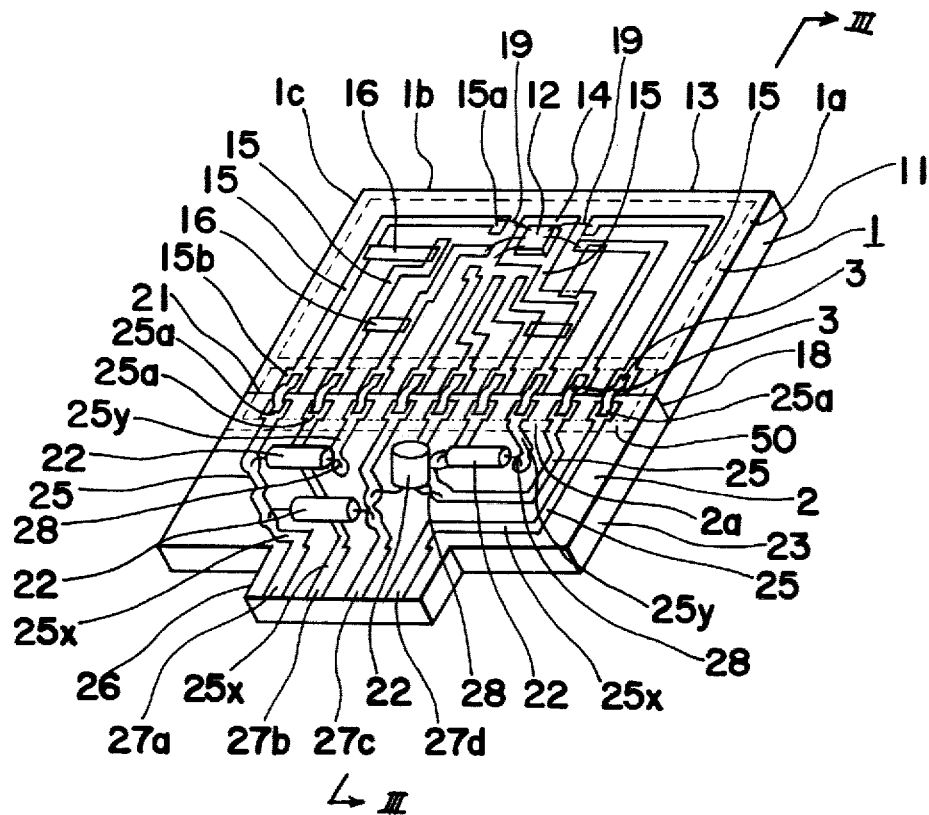
FIG. 1 shows a perspective view of an embodiment of a hybrid integrated circuit unit according to the present invention with a respective casing omitted.
Figure 3:
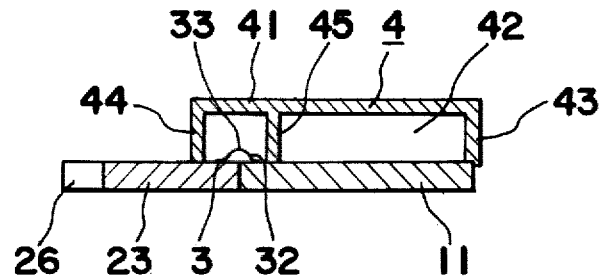
FIG. 3 is a cross sectional view along the line of FIG. 1 with the casing omitted in FIG. 1 in place.

Referring to FIG. 1, a hybrid integrated circuit unit is essentially comprises a hybrid integrated circuit assembly 1, an adjoining printed circuit board 2, and electrically conductive connecting elements 3, covered by a casing 4 (shown in FIG. 3).

The hybrid integrated circuit assembly 1 has a rectangular base plate 11, made of a highly thermally conducting material, such as aluminum, the surface of which is provided with an oxidized film formed by anodic oxidation for electrical insulation. The base plate 11 is adapted to have a large heat radiation effect facilitating mounting of high power semiconductor circuit elements.

A plurality of printed conductors 15 are formed on a main surface 13 of the base plate 11 with a desired pattern by etching a copper film provided on the main surface 13 in a manner similar to that used for printed circuit boards.

A semiconductor device 12, such as a power transistor or monolithic intergrated circuit, is mounted on the main surface 13 of base plate 11 by a bonding pad 14 formed on the base plate 11 as a part of one of the printed conductors 15. The semiconductor device 12 is fixed on the bonding pad 14 by an electroconductive adhesive such as silver paste or solder.

In the embodiment shown in FIG. 1, each of the elongated printed coductors 15 is formed to begin at one end 15a positioned near the semiconductor device 12 and end at another end 15b positioned near a peripheral edge 18 facing a corresponding peripheral edge 21 of the printed circuit board 2. These ends 15b are used as circuit assembly 1's connecting terminals.

The respective lead wires 19 of the semiconductor device 12 are connected to the corresponding ends 15a of the printed conductors 15 by a known bonding macine so as to hook up the semiconductor device 12 with discrete elements 22 disposed on printed circuit board 2 or in external circuit arrangements hooked to terminals 27.

On the integrated circuit assembly 1, there are formed, by screen printing, one or more resistors 16 connected between two predetermined printed conductors 15.

The integrated circuit assembly 1 can be manufactured by a fully automated bulk production system by using already available automatic copper etching, screen printing, and bonding techiques.

As an example of a bulk production method, a plurality of integrated circuit assemblies, each similar to integrated circuit assembly 1 of FIG. 1, can be made simultaneously in a row on one long base strip and then separated into individual assemblies by press punching.

The printed circuit board 2 has a generally rectangular base plate 23 made of an electrically insulating material, such as glass or epoxy resin, on which and a conducting copper film has been formed.

The copper film is etched to form a desired pattern of printed conductors 25 on the base plate 23. Each of the printed conductors 25 has one end 25a situated somewhere along peripheral edge 21 opposite to a corresponding connecting terminal 15b of the printed conductors 15 of the integrated circuit assembly 1.

In the embodiment shown in FIG. 1, some of the printed conductors 25x extend to a projected portion, or tongue portion, 26 of insulated printed circuit board 2 to provide male connecting terminals 27; the remaindering printed conductors terminate within the printed circuit board 2.

The discrete circuit elements 22 are situated at desired positions on the printed circuit board 2 and are mounted by inserting their lead wires 28 into corresponding insertion holes passing through printed conductors 25 and base plate 23. Each of the lead wires is bonded by solder in a known manner.

Such a printed circuit board 2 has good mass productivity, because the leads of various kinds of electric elements can be automatically inserted into the insertion holes by commercially available automatic insertion machines.

Choosing base plate 11 and 23 of the two assemblies 1 and 2 to have the same thickness will facilitate the subsequent manufacturing process.

As shown in FIG. 1, the hybrid integrated circuit assembly 1 which has been produced in bulk and the printed circuit board 2 are aligned so that the peripheral edge 18 of the integrated circuit assembly 1, and the peripheral edge 21 of the printed circuit board 2 face and abut each other; next respective ends 15b of the printed conductors 15 and the corresponding ends 25a of the printed conductors 25 are linked together by electrically conductive connecting element 3.

Figure 2:
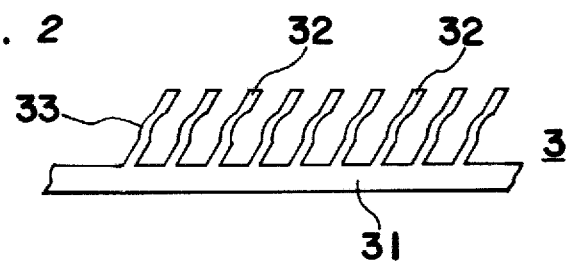
FIG. 2 is a perspective view of a connecting element employed in the unit shown in FIG. 1.

As shown in FIG. 2, electrically conductive connecting element 3 made of a metal may be provided with a plurality of leads 32 which protrude in comb form from the connecting band 31 in a pattern and number matching connecting terminals 15b or 25a.

The connecting element 3 may be secured to the IC assembly 1 and the insulated printed circuit board 2 in such a manner that said connecting band 31 is directed towards the printed circuit board 2, for example, and each ends of each lead 32 is connected to a corresponding connecting terminal end 15b or 25a, joining the terminal ends in pairs then the connecting band 31 can be cut away to produce the discrete connecting elements 3 shown in FIG. 1, then they are soldered.

If the respective upper surfaces of the base plates 11 and 23 are aligned in a common plane, all leads 32 can be simultaneously bonded to their respective connecting terminals 15b and 25a by means of a large soldering iron.

It will be appreciated that each lead 32 should have an intermediate upward arc 33 to prevent a short circuit between the base plate 11 and leads 32 during the process of soldering.

In one example, each of the leads 32 has a width of 1.5 mm, a length of 10 mm and thickness of 0.5 mm.

In order not only to enclose the assembly 1 and the board 2 but also to improve the mechanical bonding between the assembly 1 and the board 2, a casing 4 is provided on the upper surface of the assembly 1 and the board 2. Preferably, the casing 4, made by molding epoxy resin, has a box like configuration comprising an upper rectangular plate 41, side walls 42, a front wall 43, a rear wall 44, and an intermediate wall 45.

Casing 4 is adhesively or otherwise bonded to the assembly 1 and board 2 so the lower ends of the respective casing walls 42, 43, and 44 are opposed to the surface of the assembly 1 along the respective peripheral edge portions 1a, 1b and 1c, and the intermediate portion 2a as shown by the dotted lines in FIG. 1. Thus the assembly 1 and the board 2 are strongly united.

To ensure a tight connection between the assembly 1 and the board 2, an epoxy resin may be injected into the enclosed covered by the walls 42, 44 and 45 and floored by the edge portions of the assembly 1 and the board 2 having connecting terminals 15b and 25a; and in turn then the injected epoxy resin can be cured.

According to the present invention. projecting portion or tongue portion 26 may be formed on the side of the base plate 23 opposite to the side provided with the connecting terminals 25a, and provided with external electrodes 27a through 27d to form a male terminal plug. Under this arrangement, the external electrodes 27a through 27d are entirely freed from the use of externally fitted parts, and may be provided with as few external connection as an input terminal, an output terminal, a ground terminal, and a source terminal. Consequently, the external wirings can be reduced to a minimum.

Also, circuit adjustment of the hybrid integrated circuit unit in accordance with the present invention can be effected after complete assembly of elements 3. As adjustment can be made on a completed circuit unit including the discrete elemets 22 connected to but external of the integrated circuit assembly 1, it is possible to make a guarantee of the circuit specifications as of the total end product. Also, the variable resistance elements and the like can all be assembled into the hybrid integrated circuit assembly 1 as printed resistors 16 so as to adjust the over all unit distortion rate, gain and frequency characteristics within the optimum range defined by a specification by way of controlling said variable resistor and other elements for so called functional trimming.

It is another advantage of the present invention that number of the externally connected circuit components, which hitherto had been considered necessary, can thus be reduced, contributing to reduction of both size and weight.

Another advantage of the present invention is that the integrated circuit assembly and the printed circuit board can first each be separately produced by an optimum mass production technique, and then the two components can be automatically electrically and mechanically unified by the connecting means and the case means, enabling high prduction efficiency.

Also, the separate highly thermally conducting base plate of the present invention permits incorporation of a high power semiconductor device into the hybrid integrated circuit assembly. Thus high power circuits may be manufactured, such as for use in power supply units for controlling motors or stabilizing power supplies, etc. Further, the unit reaches users completely assembled and externally wiring connections are kept to a minimum, promising a considerable saving of labor.

What is claimed is:

1. A hybrid integrated circuit unit comprising
a hybrid integrated circuit assembly having a first base plate made of high heat conductive material, at least one semiconductor device mounted on the first base plate, a plurality of electrical conducting paths formed on the surface of the first base plate with a desired pattern extending to one of the peripheral edges of the base plate for providing connecting terminals, at least one resistor formed on the first base plate with the terminals of the resistor connected between two predetermined conducting paths and means for connecting the lead wires of the semiconductor device with the desired conducting paths, a printed circuit board having a second base plate of electrical insulating material disposed adjacent to the first base plate with the first peripheral edge of the second base plate opposite to said one of the peripheral edges of the first base plate, a plurality of electrical conducting paths one end of each of which is situated opposite to the corresponding connecting terminals of the first base plate on the first peripheral edge of the second base plate, the other end of at least one of the conducting paths is terminated at the second peripheral edge of the second base plate to form a connecting terminal for external connecting means and at least one discrete element located on the second base plate having connecting wires connected with the desired electric conducting paths, connecting means for connecting between the connecting terminals of the first base plate and the connecting terminals of the second base plate, and a casing means secured to both of the surfaces of the first base plate and the second base plate for connecting the first base plate and the second base plate to unify thereof.

2. A hybrid integrated circuit unit according to claim 1, wherein said first base plate and the second base plate have a substantially same thickness and respective surfaces thereof are aligned in a same plane.

3. A hybrid integrated circuit unit according to claim 1, wherein said first base plate is made of an aluminum plate having its surface electrically insulated.

4. A hybrid integrated circuit unit according to claim 1, wherein each of the connecting means is made of a strip bent in an arcute configuration.

5. A hybrid integrated circuit unit according to claim 1, wherein said connecting means are made in such a manner that a plurality of strips extending parallely from a common plate are bonded with corresponding connecting terminals of the first and the second base plates, then in turn said common plate is removed.

6. A hybrid integrated circuit unit according to claim 1, wherein said printed circuit board is further provided with a plurality of terminals for an external connector.

7. A hybrid intergrated circuit unit according to claim 1, wherein said casing means is secured to said first base plate and said second base plate by adhesives.

8. A hybrid integrated circuit unit according to claim 1, wherein said casing means is filled with synthetic resin.

* * * * *